United States Patent
Lee et al.

(10) Patent No.: US 9,449,915 B2
(45) Date of Patent: Sep. 20, 2016

(54) SEMICONDUCTOR DEVICE AND METHOD OF MANUFACTURING THE SAME

(71) Applicant: MACRONIX International Co., Ltd., Hsinchu (TW)

(72) Inventors: Hong-Ji Lee, Hsinchu (TW); Hsu-Sheng Yu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/582,935

(22) Filed: Dec. 24, 2014

(65) Prior Publication Data

US 2016/0190061 A1 Jun. 30, 2016

(51) Int. Cl.
*H01L 23/52* (2006.01)
*H01L 23/522* (2006.01)
*H01L 21/768* (2006.01)
*H01L 29/06* (2006.01)

(52) U.S. Cl.
CPC ..... *H01L 23/5226* (2013.01); *H01L 21/76804* (2013.01); *H01L 21/76831* (2013.01); *H01L 21/76843* (2013.01); *H01L 29/0649* (2013.01)

(58) Field of Classification Search
CPC .............. H01L 29/401; H01L 21/823835; H01L 23/5226; H01L 21/76804; H01L 21/76831; H01L 29/0649
USPC .......................................... 257/758; 438/637
See application file for complete search history.

(56) References Cited

U.S. PATENT DOCUMENTS

| | | | |
|---|---|---|---|
| 2004/0227242 A1* | 11/2004 | Noguchi | H01L 21/314 257/751 |
| 2005/0020057 A1 | 1/2005 | Kudo et al. | |
| 2010/0270686 A1* | 10/2010 | Nakao | H01L 21/7684 257/774 |
| 2011/0027544 A1 | 2/2011 | Nakano | |
| 2013/0157460 A1* | 6/2013 | Fu | H01L 21/28052 438/660 |
| 2014/0061929 A1* | 3/2014 | Inaba | H01L 23/52 257/762 |
| 2014/0193969 A1* | 7/2014 | Hull | H01L 29/401 438/591 |
| 2014/0203344 A1* | 7/2014 | Hopkins | H01L 29/42324 257/316 |
| 2014/0284671 A1* | 9/2014 | Hung | H01L 21/28 257/296 |
| 2015/0076649 A1* | 3/2015 | Kim | H01L 27/14609 257/446 |
| 2015/0140797 A1* | 5/2015 | Hopkins | H01L 29/42324 438/589 |
| 2015/0243754 A1* | 8/2015 | Wu | H01L 29/4966 257/412 |
| 2015/0263169 A1* | 9/2015 | Gu | H01L 29/7843 257/635 |

FOREIGN PATENT DOCUMENTS

| | | |
|---|---|---|
| CN | 1534750 | 10/2004 |
| TW | 486755 | 5/2002 |
| TW | 201413889 | 4/2014 |

OTHER PUBLICATIONS

"Office Action of Taiwan Counterpart Application," issued on Apr. 21, 2016, p. 1-p. 5.

* cited by examiner

*Primary Examiner* — Nathan W Ha
(74) *Attorney, Agent, or Firm* — J.C. Patents

(57) ABSTRACT

Provided is a semiconductor device and a method of manufacturing the same. The semiconductor device includes a substrate and a dielectric layer. The dielectric layer is located on the substrate. The dielectric layer has a plurality of openings, and side walls of the openings have concave-and-convex profile.

17 Claims, 3 Drawing Sheets

SEMICONDUCTOR DEVICE AND METHOD OF MANUFACTURING THE SAME

BACKGROUND OF THE INVENTION

1. Field of the Invention

The invention relates to a semiconductor device and a method of manufacturing the same.

2. Description of Related Art

To prevent the semiconductor device from being interfered by mobile ions (such as Fe, Cu, Al, In, Co), layers such as a silicon nitride layer, a silicon oxide layer, etc., is formed on the substrate to protect the semiconductor device. However, the layers that protect the semiconductor device may be easily damaged when forming a contact opening, and a passage that allows the mobile ions to pass is formed along the sidewall of the contact opening, thus the mobile ions diffusing to an implanted area (i.e., active area, source/drain areas, etc.) and damaging the semiconductor device. Thus, how to reduce the influence of the mobile ions on the semiconductor devices is certainly an issue to work on.

SUMMARY OF THE INVENTION

The invention provides a semiconductor device and a method of manufacturing the same capable of blocking diffusion of mobile ions by making a sidewall of a contact opening formed with a concave-and-convex profile to increase a movement path of mobile ions, so as to effectively reduce damages to a semiconductor device by the mobile ions, thereby improving the reliability of the semiconductor device.

The invention provides a semiconductor device including a substrate and a dielectric layer. The dielectric layer is located on the substrate, wherein the dielectric layer has a plurality of openings, and sidewalls of the openings have a concave-and-convex profile.

According to an embodiment of the invention, in the semiconductor device, the dielectric layer includes a plurality of first layers and at least one second layer, wherein the second layer is interposed between two of the first layers.

According to an embodiment of the invention, in the semiconductor device, the dielectric layer includes a plurality of the second layers, and the second layers and the first layers are alternately disposed.

According to an embodiment of the invention, in the semiconductor device, a material of the first layer is different from a material of the second layer.

According to an embodiment of the invention, in the semiconductor device, the first layer includes oxide, a low-k dielectric material, a spin-on material, or a combination thereof.

According to an embodiment of the invention, in the semiconductor device, the second layer includes nitride, carbide, nitrogen carbide, oxynitride, or a combination thereof.

According to an embodiment of the invention, in the semiconductor device, the second layer protrudes with respect to the first layer and extends into the opening.

According to an embodiment of the invention, the semiconductor device further includes a plurality of barrier layers and a plurality of conductive plugs. Each of the barrier layers has a concave-and-convex profile and covers the sidewall of the opening. The conductive plugs are located in the openings and cover the barrier layers.

The invention also provides a semiconductor device including a substrate, a dielectric layer, and a plurality of conductive plugs. The dielectric layer is located on the substrate and has a plurality of openings. The conductive plugs are located in the openings, wherein a sidewall of each of the conductive plugs has a concave-and-convex profile.

According to an embodiment, the semiconductor device further includes a plurality of barrier layers located on sidewalls of the openings of the dielectric layer and between the dielectric layer and the conductive plugs, and an inner surface and an exterior surface of each of the barrier layers have the concave-and-convex profile.

The invention also provides a method of manufacturing a semiconductor device, including: alternately forming a plurality of first layers and at least one second layer on a substrate; forming a plurality of openings in the first and second layers; and removing a part of the first layers on sidewalls of the openings, such that the openings are formed to have the sidewalls with a concave-and-convex profile.

According to an embodiment of the invention, in the method of manufacturing the semiconductor device, a method of forming the openings in the first and second layers includes performing a plasma etching process, a radio frequency power used in the process is in a range of 300 Watts to 5000 Watts, and a gas used in the process includes a gas mixture of perfluorocarbon with a carbon number of 1 to 5, fluorocarbon with a carbon number of 1 to 2, $O_2$, Ar, and $N_2$.

According to an embodiment of the invention, in the method of manufacturing the semiconductor device, a method and a gas used in the step of removing the part of the first layers on the sidewalls of the openings, such that the openings are formed to have the sidewalls with the concave-and-convex profile and the method and the gas used in the step of forming the openings are the same, while the radio frequency power is decreased and a flow rate of $O_2$ is increased by 1.5 times to 3 times.

According to an embodiment of the invention, in the method of manufacturing the semiconductor device, a method of removing the part of the first layers on the sidewalls of the openings includes performing an isotropic etching process.

According to an embodiment of the invention, in the method of manufacturing the semiconductor device, the isotropic etching process includes performing a plasma etching process.

According to an embodiment of the invention, in the method of manufacturing the semiconductor device, the plasma etching process includes using a remote plasma.

According to an embodiment of the invention, in the method of manufacturing the semiconductor device, a gas used in the remote plasma includes gases of $NF_3/NH_3/H_2$ or $HF/H_2/NH_3$.

According to an embodiment of the invention, in the method of manufacturing the semiconductor device, the isotropic etching process includes performing a wet etching process.

According to an embodiment of the invention, in the method of manufacturing the semiconductor device, the wet etching process includes using diluted hydrofluoric acid or an etching buffer solution.

According to an embodiment of the invention, in the method of manufacturing the semiconductor device, an etching selectivity ratio of the first layer with respect to the second layer is in a range of 1.5:1 to 100:1.

Based on the above, the semiconductor device and the method of manufacturing the semiconductor device provided in the invention are capable of forming the contact opening having the sidewall with the concave-and-convex profile, increasing a movement path of mobile ions, blocking diffusion of the mobile ions, and consequently effectively reducing damages to the semiconductor device by the mobile ions, thereby improving the reliability of the semiconductor device.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
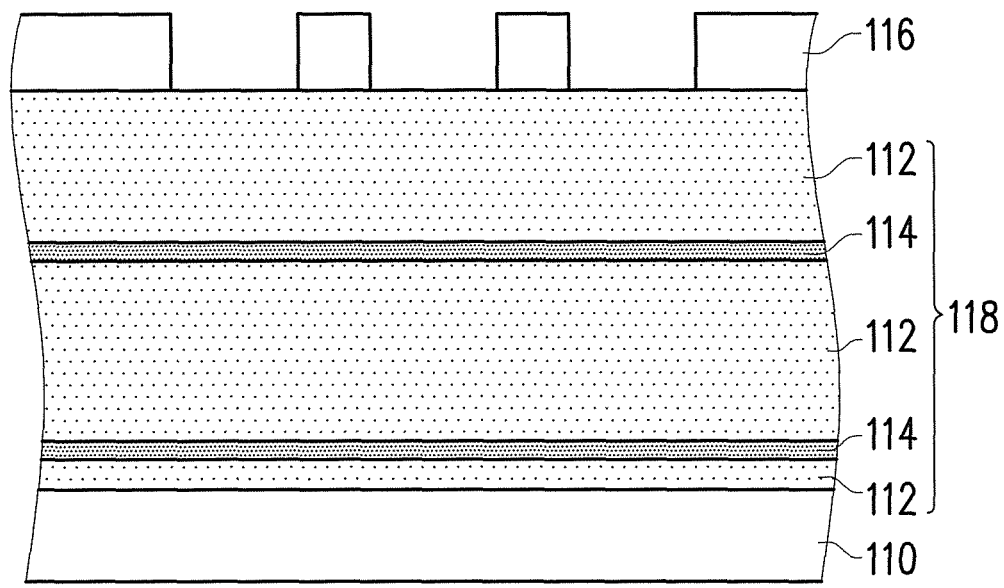
FIGS. 1A to 1F are cross-sectional schematic views illustrating a method of manufacturing a semiconductor device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1F are cross-sectional schematic views illustrating a method of manufacturing a semiconductor device according to an embodiment of the invention.

Referring to FIG. 1A, a substrate 110 is provided. The substrate 110 is a semiconductor substrate, a semiconductor compound substrate, or a semiconductor over insulator (SOI) substrate, for example. The semiconductor includes atoms of Group IVA, for example, such as silicon or germanium. The semiconductor compound is a semiconductor compound formed of atoms of Group IVA, for example, such as silicon carbide or silicon germanium, or a semiconductor compound formed of atoms of Group IIIA and Group of VA, for example, such as gallium arsenide. The substrate 110 may be doped, and a dopant of the substrate 110 may be P-type or N-type. The P-type dopant may be ions of Group IIIA, such as boron ions. The N-type dopant may be ions of Group VA, such as arsenic or phosphorus.

Continuing to refer to FIG. 1A, a dielectric layer 118 is formed on the substrate 110. In an embodiment, the dielectric layer 118 includes a first layer 112 and a second layer 114 that are foamed alternately. In an exemplary embodiment, the dielectric layer 118 includes a plurality of the first layers 112 and at least one second layer 114, and each of the second layers 114 is respectively interposed between two of the first layers 112. In another exemplary embodiment of the invention, the dielectric layer 118 includes a plurality of the first layers and 112 a plurality of the second layers 114. In FIG. 1A, three first layers 112 and two second layers 114 are shown. However, the invention is not limited thereto. The first layer 112 and the second layer 114 are formed of different materials. A material of the first layer 112 includes oxide, a low-k dielectric material, a spin-on material, or a combination thereof, such as silicon oxide, phosphosilicate glass (PSG), borophosphosilicate glass (BPSG), F-doped oxide, C-doped oxide, H-doped oxide, porous oxide, or a combination thereof. A material of the second layer 114 includes nitride, carbide, nitrogen carbide, oxynitride, or a combination thereof, such as silicon nitride, silicon carbide, silicon carbide nitride, silicon oxynitride, or a combination thereof. A method of forming the first layer 112 and the second layer 114 is performing a chemical vapor deposition process, or a spin-on process, for example. A thickness of each first layer 112 is in a range of 10 nm to 600 nm, for example, and a thickness of each second layer 114 in a range of 5 nm to 60 nm, for example. However, the invention is not limited thereto.

Figure 1B:
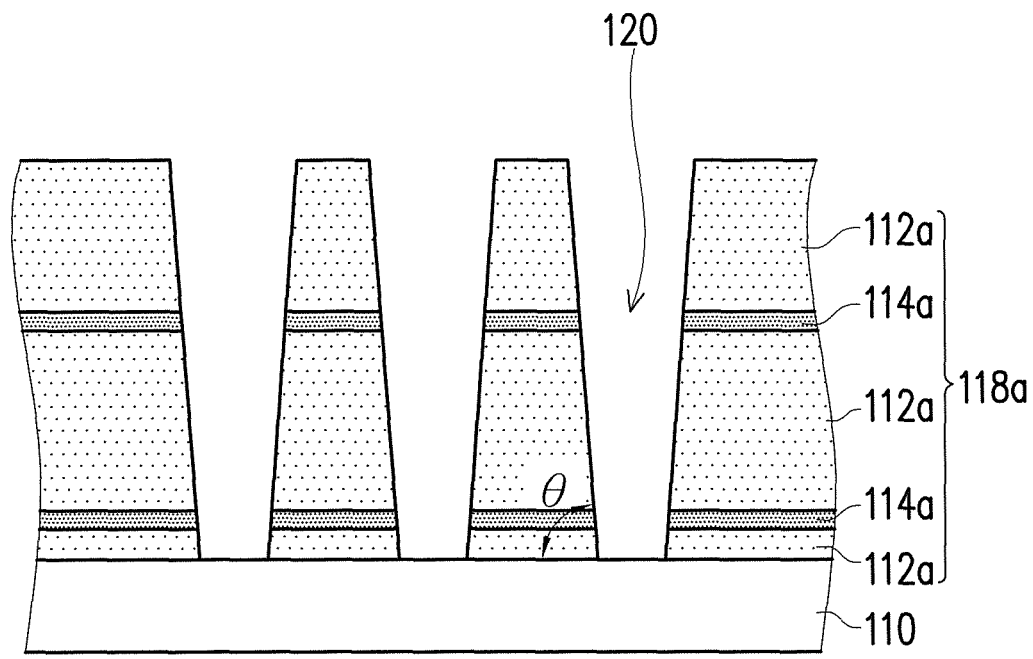

Referring to FIGS. 1A and 1B, a patterned mask layer 116 is formed on the dielectric layer 118. Then, the first and second layers 112 and 114 are patterned to form a dielectric layer 118a having a plurality of openings 120. The opening 120 may be a single damascene opening or a dual damascene opening. The single damascene opening is a contact opening or a via opening, for example. The contact opening or the via opening may be approximately perpendicular to a surface of the substrate 110 or may form an angle with the surface of the substrate 110, with no particular limitation. In an embodiment of the invention, the sidewall of the opening 120 forms an angle θ with respect to a surface of the substrate 110, such that a cross section of the opening 120 forms a reversed trapezoid. The angle θ is in a range of 75 to 90 degrees, for example. The dual damascene opening includes a trench and a contact opening or includes a trench and a via opening, for example. The trench is located on the top of the contact opening or the via opening, and an extending direction of the trench is approximately parallel to the surface direction of the substrate 110. The contact opening or the via opening may be approximately perpendicular to a surface of the substrate or may form an angle with the surface of the substrate 110, with no particular limitation. In an embodiment of the invention, the opening 120 is a dual damascene opening, and the sidewall of the contact opening or the via opening of which may be perpendicular to a surface of the substrate 110 or may form an angle with the surface of the substrate 110, with no particular limitation. In an embodiment of the invention, the sidewall of the contact opening or the via opening forms an angle θ with respect to a surface of the substrate 110, such that a cross section of the opening 120 forms a reversed trapezoid. The angle θ is in a range of 75 to 90 degrees, for example.

A method of patterning the first and second layers 112 and 114 includes performing a plasma etching process. A radio frequency power of the plasma etching process is in a range of 300 Watts to 5000 Watts, for example, and a gas used in the process is a gas mixture of $C_mF_n$, $C_xH_yF_z$, $O_2$, Ar, $N_2$, for example. In addition, m is an integer of 1 to 5, n is an integer of 4 to 8, x is an integer of 1 to 2, y is an integer of 1 to 4, and z is an integer of 2 to 3. More specifically, $C_mF_n$ is perfluorocarbon with a carbon number of 1 to 5, for example, and $C_xH_yF_z$ is fluorocarbon with a carbon number of 1 to 2, for example. The perfluorocarbon with a carbon number of 1 to 5 is perfluoroalkane with a carbon number of 1 to 3, perfluoroalkene with a carbon number of 2 to 4, perfluoroalkyne with a carbon number of 3 to 5, or a combination thereof, for example. The fluorocarbon with a carbon number of 1 to 2 is fluoroalkane with a carbon number of 1 to 2, fluoroalkene with a carbon number of 2, or a combination thereof, for example.

In an embodiment, the method of patterning the first and second layers 112 and 114 includes performing a plasma etching process. In addition, a radio frequency power of the plasma etching process is in a range of 300 Watts to 5000 Watts, for example, a flow rate of perfluorocarbon with a carbon number of 1 to 5 is in a range of 15 sccm to 50 sccm, for example, a flow rate of fluorocarbon with a carbon number of 1 to 2 is in a range of 35 sccm to 200 sccm, for example, a flow rate of $O_2$ is in a range of 5 sccm to 50 sccm, for example, a flow rate of Ar is in a range of 100 sccm to 600 sccm, for example, and a flow rate of $N_2$ is in a range of 30 sccm to 300 sccm, for example.

Figure 1C:
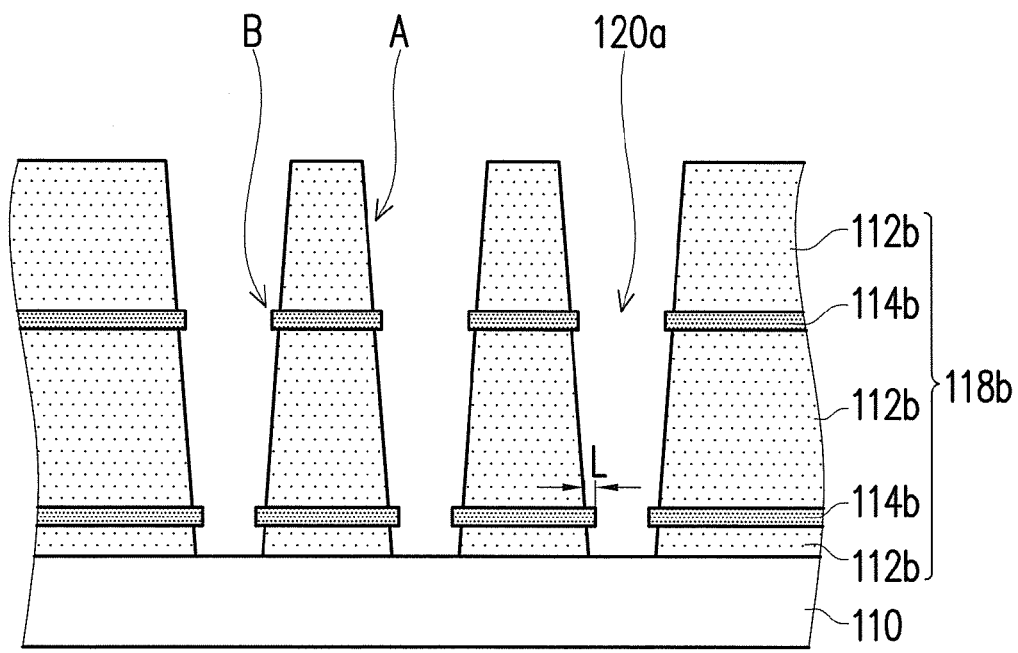

Next, referring to FIG. 1C, by using an suitable etchant, a part of a first layer 112a on the sidewall of the opening 120 is removed, in other words, the sidewall of the first layer 112a is pulled back, so as to form a dielectric layer 118b having openings 120a. The sidewalls of the openings 120a have a concave-and-convex profile, for example, a ladder-like profile. In this embodiment, an etching selectivity ratio of the first layer 112a with respect to a second layer 114b is in a range of 1.5:1 to 100:1. The step of removing the part of the first layer 112a on the sidewall of the opening 120 and the step of forming the opening 120 may be performed in-situ. However, the invention is not limited thereto. In other embodiments, the steps may also be performed ex-situ.

A method of removing the part of the first layer 112a on the sidewall of the opening 120 includes performing an isotropic etching process, and the isotropic etching process includes performing a plasma etching process or a wet etching process. In an embodiment of the invention, the part of the first layer 112a on the sidewall of the opening 120 is removed by performing the plasma etching process. Parameters, gases, or a flow rate of each of the gases used in a plasma process for removing the part of the first layer 112a on the sidewall of the opening 120 may be the same or different from those used in the plasma process for forming the opening 120. The gas for removing the part of the first layer 112a on the sidewall of the opening 120 is a gas mixture of $C_mF_n$, $C_xH_yF_z$, $O_2$, Ar, and $N_2$, for example. In addition, m is an integer of 1 to 5, n is an integer of 4 to 8, x is an integer of 1 to 2, y is an integer of 1 to 4, and z is an integer of 2 to 3. More specifically, $C_mF_n$ is perfluorocarbon with a carbon number of 1 to 5, for example, and $C_xH_yF_z$ is fluorocarbon with a carbon number of 1 to 2, for example. The perfluorocarbon with a carbon number of 1 to 5 is perfluoroalkane with a carbon number of 1 to 3, perfluoroalkene with a carbon number of 2 to 4, perfluoroalkyne with a carbon number of 3 to 5, or a combination thereof, for example. The fluorocarbon with a carbon number of 1 to 2 is fluoroalkane with a carbon number of 1 to 2, fluoroalkene with a carbon number of 2, or a combination thereof, for example.

In an embodiment, a plasma etching process is used in the step of removing the part of the first layer 112a on the sidewall of the opening 120, and the gas used in this step is the same as the gas used in the step of forming the opening 120. However, the flow rate of $O_2$ is increased (by 1.5 times to 3 times, for example), and the radio frequency power is decreased to, for example, a range of 300 Watts to 1500 Watts.

In another embodiment of the invention, the method of removing the part of the first layer 112a on the sidewall of the opening 120 by performing the plasma etching process includes using a remote plasma. A gas used in the remove plasma includes gases of $NF_3/NH_3/H_2$ or $HF/H_2/NH_3$. A ratio of the respective gases is 10:20:1, for example. However, the invention does not intend to impose a limitation in this respect. In yet another embodiment of the invention, the part of the first layer 112a on the sidewall of the opening 120 is removed by performing a wet etching process. The wet etching process includes using diluted hydrofluoric acid or an etching buffer solution.

After the part of the first layer 112a on the sidewall of the opening 120 is removed, a first layer 112b is recessed with respect to the second layer 114b, and the second layer 114b protrudes with respect to the first layer 112b and extends into an opening 120b. Thus, the first layer 112b may be also referred to as a recessed part A, while the second layer 114b may also be referred to as a protruding part B. A length L of protrusion of the protruding part B with respect to the recessed part A is in a range of 1 nm to 5 nm. However, the invention is not limited thereto.

Figure 1D:
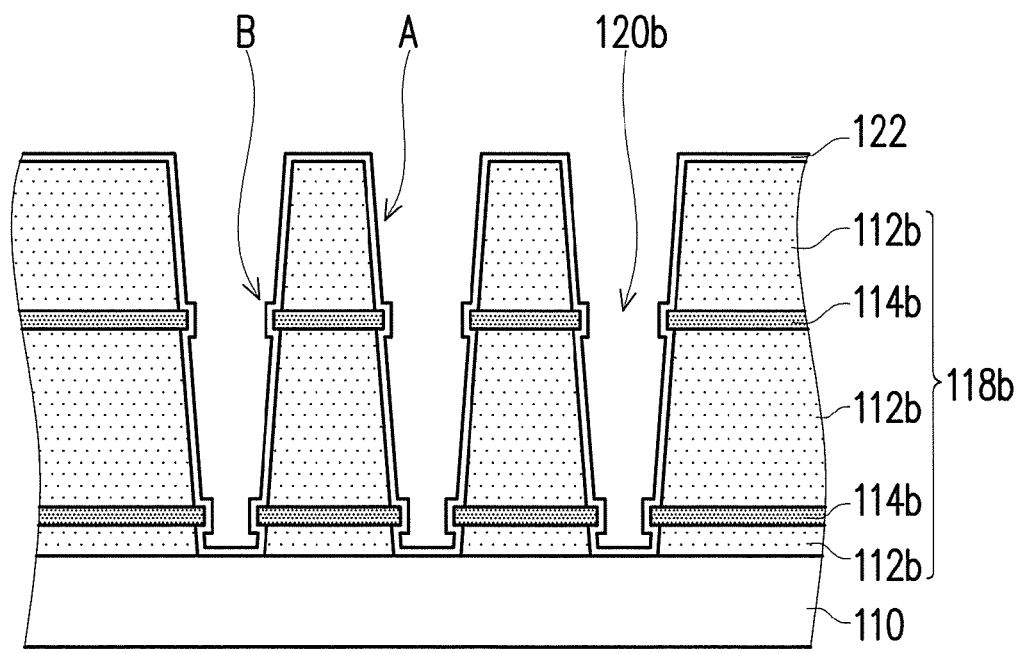

Referring to FIG. 1D, a barrier layer 122 is formed on the substrate 110 to cover a surface of the dielectric layer 118b and the sidewall of the opening 120a. A material of the barrier layer 122 includes tantalum, titanium, tantalum nitride, titanium nitride, or a combination thereof, and a method of forming the barrier layer 122 includes performing a chemical vapor deposition process, a sputtering process, or an electroplating process, for example. In an embodiment, the barrier layer 122 is a conformal layer. Therefore, since the sidewall of the opening 120b has the concave-and-convex profile, the barrier layer 122 also has the concave-and-convex profile, for example, the ladderlike profile.

Figure 1E:
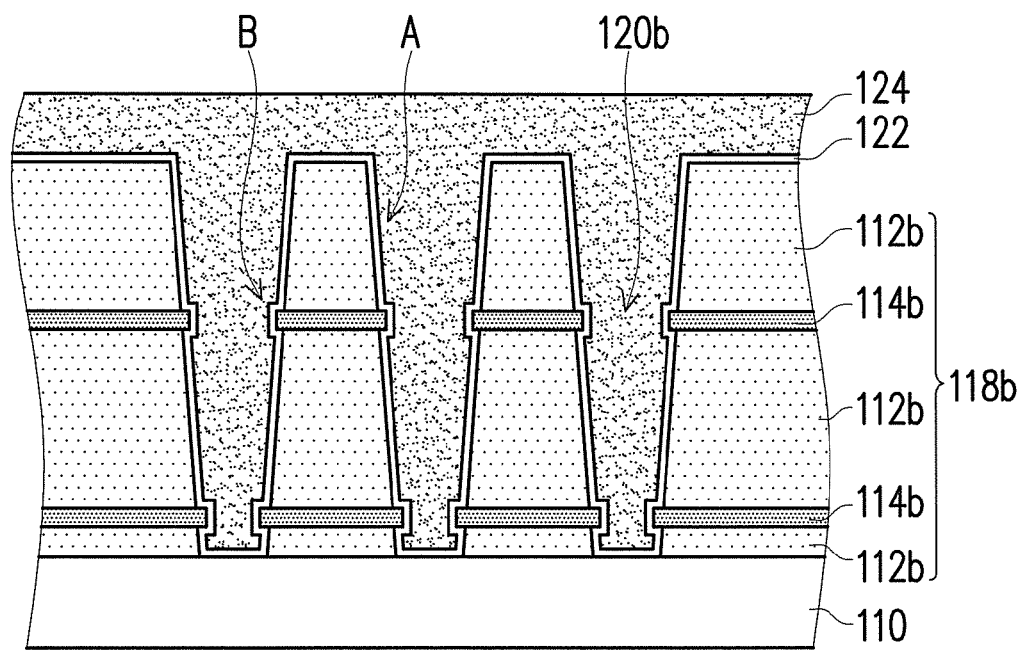
Figure 1F:
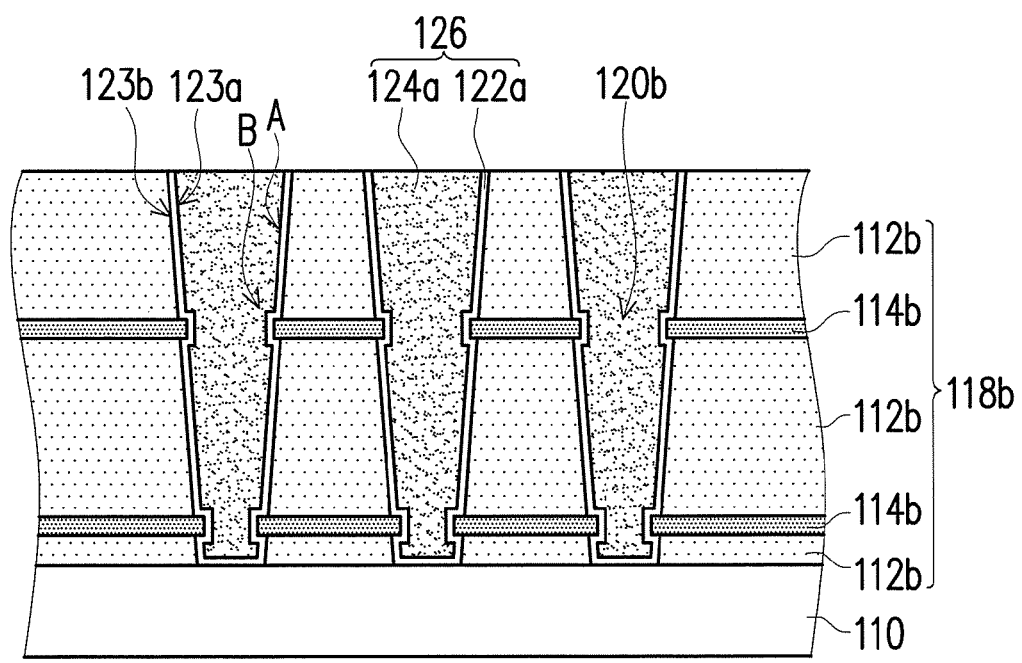

Next, referring to FIGS. 1E and 1F, a conductive layer 124 is formed on the substrate 110, and the conductive layer 124 is filled into the opening 120b. A material of the conductive layer 124 includes metal such as tungsten and aluminum, or alloy such as aluminum-copper alloy. A method of forming the conductive layer 124 includes performing a chemical vapor deposition process, a sputtering process, or an electroplating process, for example. Then, a part of the conductive layer 124 and the barrier layer 122 on the dielectric layer 118b is removed to form a barrier layer 122a and a conductive plug 124a in the opening 120b. A method of removing the part of the conductive layer 124 and the barrier layer 122 includes performing a chemical mechanical polishing process, for example. The barrier layer 122a and the conductive plug 124a together serve as a connection structure 126. In an embodiment, since the barrier layer 122a has the concave-and-convex profile, the conductive plug 124a also has the concave-and-convex profile, for example, the ladderlike profile. The connection structure 126 may be a single damascene structure or a dual damascene structure. The single damascene structure, for example, is a contact opening or a via opening, and the contact opening or the via opening has the concave-and-convex profile. The dual damascene structure includes a conductive wire and a contact opening, for example, and both the conductive wire and the contact opening include the concave-and-convex profile. Alternatively, the dual damascene structure includes a conductive wire and a via opening, for example, and both the conductive wire and the via opening include the concave-and-convex profile. The conductive wire may be a bit line or a word line.

Referring to FIG. 1F again, the semiconductor device according to an embodiment of the invention includes the substrate 110, the dielectric layer 118b, and the connection structure 126. The dielectric layer 118b is located on the substrate 110. The connection structure 126 is located in the opening 120b of the dielectric layer 118b and includes the barrier layer 122a and the conductive plug 124a. The barrier layer 122a is located on the sidewall of the opening 120b of the dielectric layer 118b. The conductive plug 124a is located in the opening 120b and covers the barrier layer 122a. In an embodiment, the sidewall of the opening 120b in the dielectric layer 118b has the concave-and-convex profile, an inner surface 123a and an exterior surface 123b of the barrier layer 122a have the concave-and-convex profile, and a sidewall of the conductive plug 124a also has the concave-and-convex profile. However, the invention is not limited thereto. In other embodiments, only the sidewall of the conductive plug 124a and the sidewall of the barrier layer 122a adjacent thereto have the concave-and-convex profile.

In view of the foregoing, the connection structure formed according to the embodiments of the invention has the concave-and-convex profile capable of increasing a movement path of mobile ions (such as Fe, Cu, Al, In, Co), blocking diffusion of the ions, and thus effectively reducing or preventing damages of the mobile ions to a semiconductor device, thereby improving the reliability of the semiconductor device. The invention may be applied to manufacturing of semiconductor devices such as dynamic random access memory (DRAM), NAND flash memory, NOR flash memory, and micro electro mechanical system (MEMS). In addition, the method of manufacturing the semiconductor device according to the invention can be easily integrated into the current manufacturing processes and have a lower cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
   a substrate; and
   a dielectric layer, located on the substrate, wherein the dielectric layer has a plurality of openings,
   wherein the dielectric layer comprises a plurality of first dielectric layers and at least one second dielectric layer interposed between two of the first dielectric layers,
   wherein a material of the first dielectric layers is different from a material of the second dielectric layers, and
   wherein the second dielectric layer protrudes with respect to the adjacent first dielectric layers that are in contact with the second dielectric layer, and the second dielectric layer extends into the adjacent openings.

2. The semiconductor device as claimed in claim 1, wherein the dielectric layer comprises a plurality of the second dielectric layers, and the second dielectric layers and the first dielectric layers are alternately disposed.

3. The semiconductor device as claimed in claim 1, wherein the first dielectric layers comprise oxide, a low-k dielectric material, a spin-on material, or a combination thereof.

4. The semiconductor device as claimed in claim 3, wherein the second dielectric layers comprise nitride, carbide, nitrogen carbide, oxynitride, or a combination thereof.

5. The semiconductor device as claimed in claim 1, further comprising:
   a plurality of barrier layers, wherein each of the barrier layers covers the sidewall of the opening; and
   a plurality of conductive plugs, located in the openings and covering the barrier layers.

6. A semiconductor device comprising:
   a substrate;
   a dielectric layer, located on the substrate and having a plurality of openings; and
   a plurality of conductive plugs, located in the openings, wherein the dielectric layer comprises a plurality of first dielectric layers and at least one second dielectric layer interposed between two of the first dielectric layers,
   wherein a material of the first dielectric layers is different from a material of the second dielectric layers,
   wherein the second dielectric layer protrudes with respect to the adjacent first dielectric layers that are in contact with the second dielectric layer, and the second dielectric layer extends into the adjacent openings.

7. The semiconductor device as claimed in claim 6, further comprising a plurality of barrier layers located on sidewalls of the openings of the dielectric layer and between the dielectric layer and the conductive plugs.

8. A method of manufacturing a semiconductor device, comprising:
   alternately forming a plurality of first dielectric layers and a plurality of second dielectric layer on a substrate;
   forming a plurality of openings in the first and second dielectric layers; and
   removing a part of the first dielectric layers on sidewalls of the openings,
   wherein a material of the first dielectric layers is different from a material of the second dielectric layers, and
   wherein the second dielectric layer protrudes with respect to the adjacent first dielectric layers that are in contact with the second dielectric layer, and the second dielectric layer extends into the adjacent openings.

9. The method of manufacturing the semiconductor device as claimed in claim 8, wherein a method of forming the openings in the first and second dielectric layers comprises performing a plasma etching process, a radio frequency power used in the process is in a range of 300 Watts to 5000 Watts, and a gas used in the process comprises a gas mixture of perfluorocarbon with a carbon number of 1 to 5, fluorocarbon with a carbon number of 1 to 2, $O_2$, Ar, and $N_2$.

10. The method of manufacturing the semiconductor device as claimed in claim 9, wherein a method and a gas used in the step of removing the part of the first dielectric layers on the sidewalls of the openings and the method and the gas used in the step of forming the openings are the same, while the radio frequency power is decreased and a flow rate of $O_2$ is increased by 1.5 times to 3 times.

11. The method of manufacturing the semiconductor device as claimed in claim 8, wherein a method of removing the part of the first dielectric layers on the sidewalls of the openings comprises performing an isotropic etching process.

12. The method of manufacturing the semiconductor device as claimed in claim 11, wherein the isotropic etching process comprises performing a plasma etching process.

13. The method of manufacturing the semiconductor device as claimed in claim 12, wherein the plasma etching process comprises using a remote plasma.

14. The method of manufacturing the semiconductor device as claimed in claim 13, wherein a gas used in the remote plasma comprises gases of $NF_3/NH_3/H_2$ or $HF/H_2/NH_3$.

15. The method of manufacturing the semiconductor device as claimed in claim 11, wherein the isotropic etching process comprises performing a wet etching process.

16. The method of manufacturing the semiconductor device as claimed in claim 15, wherein the wet etching process comprises using diluted hydrofluoric acid or an etching buffer solution.

17. The method of manufacturing the semiconductor device as claimed in claim 8, wherein an etching selectivity ratio of the first dielectric layers with respect to the second dielectric layers is in a range of 1.5:1 to 100:1.

* * * * *